United States Patent
Dome et al.

(10) Patent No.: US 9,817,049 B2
(45) Date of Patent: Nov. 14, 2017

(54) DEVICE AND PROCEDURE FOR THE MONITORING OF A TRAILER CONNECTION BOX

(71) Applicant: Hella KGaA Hueck & Co., Lippstadt (DE)

(72) Inventors: Juri Dome, Würzburg (DE); Jan Schmäling, Bad Brückenau (DE)

(73) Assignee: Hella KGaA Hueck & Co., Lippstadt (DE)

( * ) Notice: Subject to any disclaimer, the term of this patent is extended or adjusted under 35 U.S.C. 154(b) by 147 days.

(21) Appl. No.: 14/781,080

(22) PCT Filed: Apr. 2, 2014

(86) PCT No.: PCT/EP2014/056566
§ 371 (c)(1),
(2) Date: Sep. 29, 2015

(87) PCT Pub. No.: WO2014/161871
PCT Pub. Date: Oct. 9, 2014

(65) Prior Publication Data
US 2016/0209452 A1    Jul. 21, 2016

(30) Foreign Application Priority Data
Apr. 3, 2013    (DE) .................. 10 2013 103 307

(51) Int. Cl.
*G01R 31/02* (2006.01)
*G01R 31/00* (2006.01)
*G01R 31/04* (2006.01)

(52) U.S. Cl.
CPC ......... *G01R 31/006* (2013.01); *G01R 31/045* (2013.01); *G01R 31/026* (2013.01)

(58) Field of Classification Search
USPC ......................... 324/503, 504, 510
See application file for complete search history.

(56) References Cited

U.S. PATENT DOCUMENTS

| 3,103,808 A | 9/1963 | Eichelberger |
| 4,547,722 A | 10/1985 | Sarlo |

(Continued)

FOREIGN PATENT DOCUMENTS

| DE | 100 06 490 A1 | 8/2001 |
| DE | 10 2005 028184 | 12/2006 |
| DE | 10 2011 101 467 A | 11/2012 |

*Primary Examiner* — Vincent Q Nguyen
(74) *Attorney, Agent, or Firm* — Husch Blackwell LLP

(57) ABSTRACT

A device for the monitoring of a trailer connection box of a vehicle to which the electrical system of a trailer can be connected. The device may include a circuit having a first connection (VBB) for the connection with a positive potential of a voltage of an electric system of the vehicle. The device may include second connections (Brkl, POSLL, POS LR, TurnSL, TurnSR, RevL, FogL) for the connection with contacts of the trailer connection box. The device may include a current and/or voltage sensor (SI), with first controllable switches (S11, . . . , S17), being connected in series to one of the second connections (Brkl, POSLL, POS LR, TurnSL, TurnSR, RevL, FogL) each. In a closed state of the first switch (S11, . . . , S17) is connected in series to the second connection (Brkl, POSLL, POS LR, TurnSL, TurnSR, RevL, FogL), each of the second connections (Brkl, POSLL, POS LR, TurnSL, TurnSR, RevL, FogL) is connected via this first switch (S11, . . . , S17) with a first node (K). The first node (K) is connected to the first connection (VBB) via the current and/or voltage sensor (SI).

8 Claims, 2 Drawing Sheets

(56) References Cited

U.S. PATENT DOCUMENTS

| | | | |
|---|---|---|---|
| 4,866,390 A | 9/1989 | Butchko | |
| 7,339,465 B1 | 3/2008 | Cheng | |
| 2009/0212784 A1 | 8/2009 | Kilian | |
| 2010/0176830 A1 | 7/2010 | Watson | |
| 2013/0278272 A1* | 10/2013 | Kaminski | G01R 27/18 |
| | | | 324/510 |
| 2015/0298697 A1* | 10/2015 | Kelly | B60W 50/082 |
| | | | 701/37 |

* cited by examiner

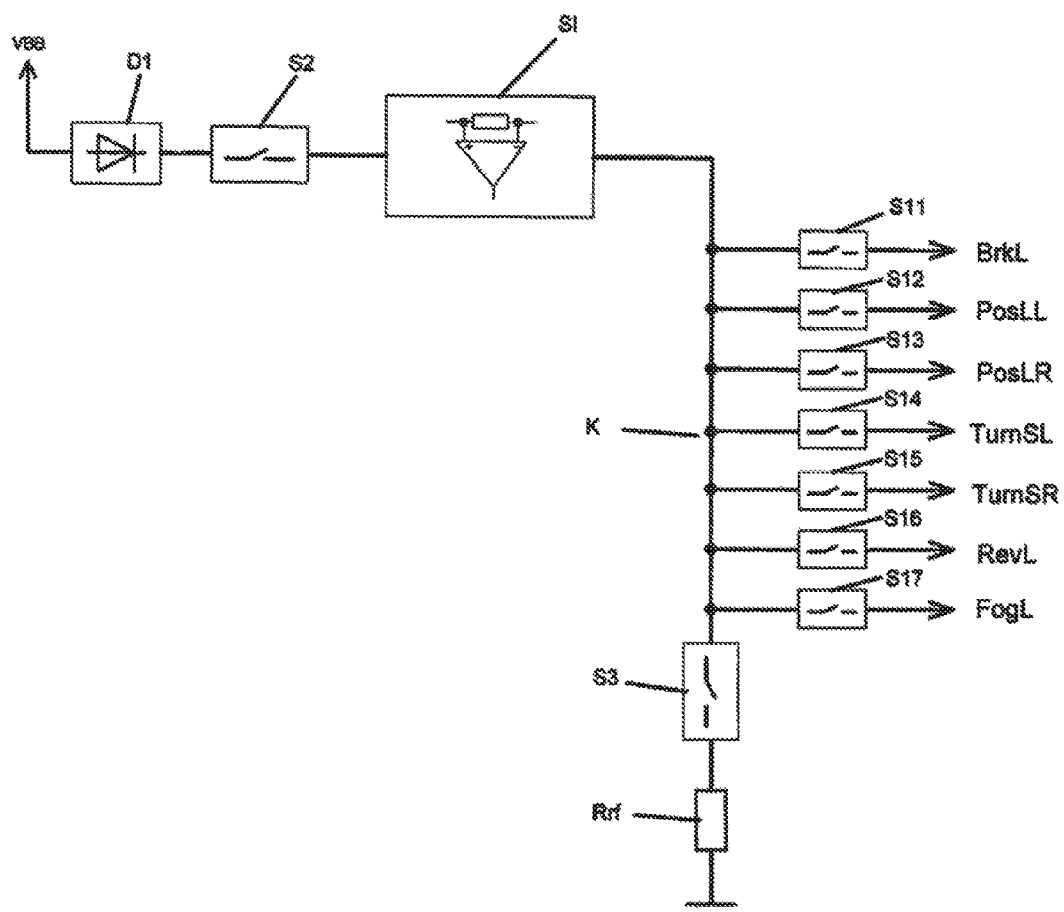

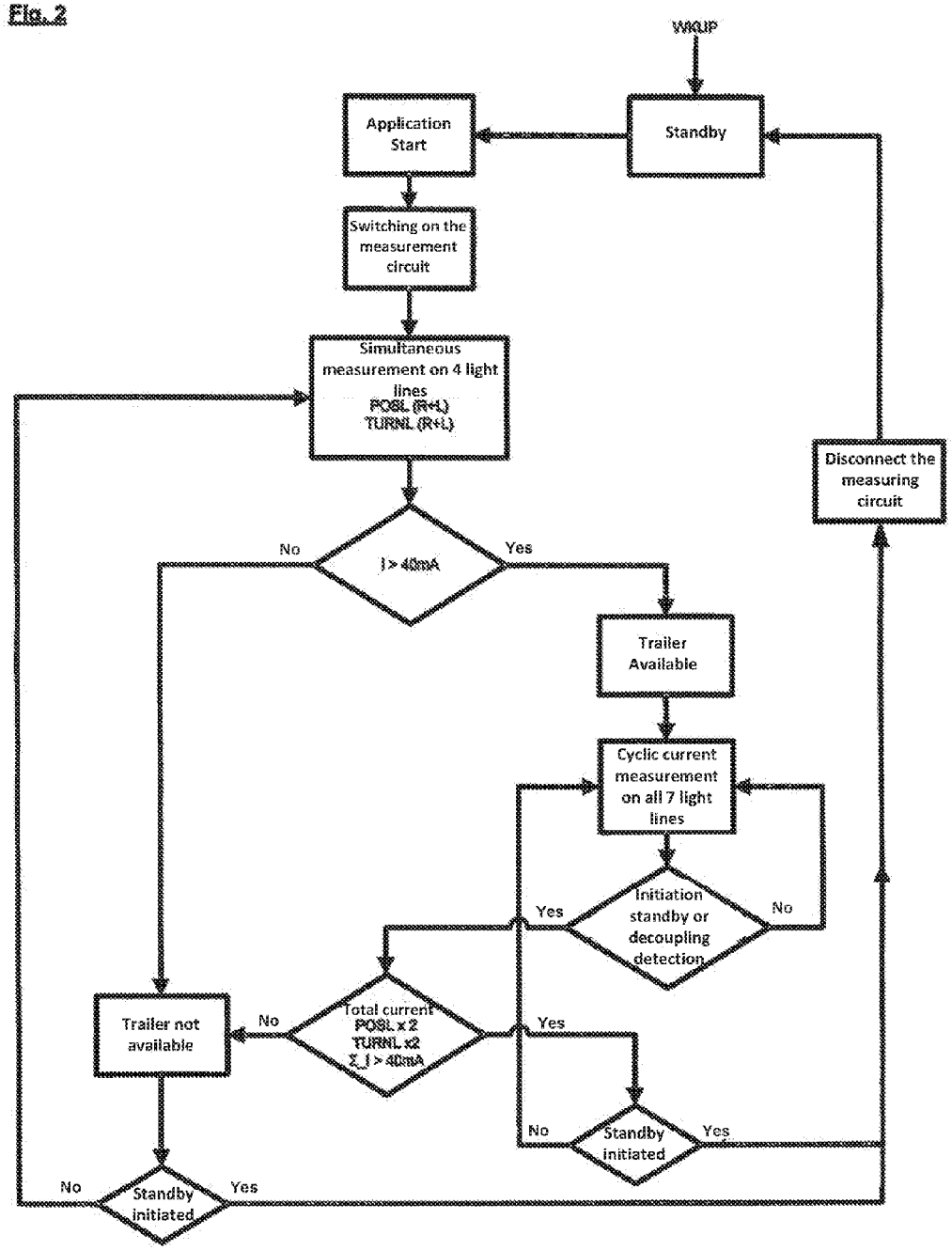

DEVICE AND PROCEDURE FOR THE MONITORING OF A TRAILER CONNECTION BOX

CROSS REFERENCE

This application claims priority to Patent Cooperation Treaty application PCT/EP2014/056566, filed Apr. 2, 2014, which itself claims priority to German Application No. 10 2013 103307.5, filed Apr. 3, 2013, both of which are hereby incorporated by reference.

FIELD OF TECHNOLOGY

The invention relates to a device for the monitoring of a trailer connection box of a vehicle to which the electrical system of a trailer can be connected.

BACKGROUND

To participate in road traffic with a trailer connected to a drawing vehicle, the trailer must be equipped with lighting according to regulation. Therefore, vehicle trailers have an electric system to which several different lamps are connected. Usually, a RH and a LH tail lamp, a RH and a LH direction indicator and stop lights are compulsory. In addition, a back-up light and a rear fog lamp can be installed. It must be possible to control the different lamps from the towing vehicle. Usually, this is achieved by connecting each lamp of the trailer with an individual line to the control unit in the drawing vehicle. The stop lamps are connected to the control unit by means of a common line. These lines are led through a plug-connection between the drawing vehicle and the trailer. On the drawing vehicle side, the trailer connection box forming part of the plug-connection is provided, which interacts with a connector forming part of the plug connection on the trailer side. In the trailer connection box as well as in the connector, contacts are provided by means of which the sections of the lines between the control unit and the connection box on one hand and between the connector and the lamps on the other hand can be connected.

A device for the monitoring of a trailer connection box of the type initially mentioned known to the applicant comprises several circuits having the following layout:

Each circuit has a first connection for the connection with a positive potential of a voltage of a vehicle electric system, a second connection for the connection with a contact of the trailer connection box, a measuring resistor being arranged between the first and the second contact, a first voltage sensor and a first voltage divider being equipped for the voltage measurement on a first side of the measuring resistor, a second voltage sensor and a second voltage divider being equipped for the voltage measurement on a second side of the measuring resistor, and a controllable switch connected in series with the measuring resistor.

These circuits of the device known to the applicant are on one hand connected to the positive potential of a voltage of a vehicle electric system and on the other hand to a contact of the trailer connection box. As modern passenger vehicle trailers have a maximum of seven trailer lamps (in this context the stop lamps count as one lamp as they are connected to the control unit in the drawing vehicle via a common line), there must also be at least seven contacts in the connection box. These seven contacts of the connecting box must/can be monitored. This is why in the device known to the applicant there are up to seven circuits of the type described above. In older trailer variants an adapter can reduce the 13-pin trailer connection box (according to DIN) provided by the vehicle to a 7-pin connection (according to DIN) in which not all seven light lines are supported. In this case the light lines which cannot be monitored are recognized as not existing.

Even if for the detection whether a trailer is connected to the drawing vehicle or a trailer is electrically connected to the drawing vehicle only four lines resp. four contacts are required for measurement, only four of the above circuits are required for the trailer detection. Monitoring of all lamps, however, is not possible in a device with four circuits of the above type.

Due to the large number especially of active components, all devices of the type known to the applicant are very complex. Furthermore, measurements in a circuit with two voltage sensors are time-consuming and require a major computational effort for the evaluation of the measurements. Also, due to the large number of components needed for measurement, the number of measurement errors rises. These may be negatively influenced by temperature drift and aging in addition. Deviations due to analog/digital conversions also contribute to measurement deviations.

SUMMARY OF THE INVENTION

Therefore, the invention has the task of proposing a device and a procedure for the monitoring of a trailer connection box of a vehicle which is superior to the device known to the applicant resp. with is superior to a procedure executable with this device.

With regard to the device the task is solved in that the device comprises a circuit having a first connection for the connection with a positive potential of a voltage of an electric system of the vehicle, having second connections for the connection with contacts of the trailer connection box, having a current and/or voltage sensor having first controllable switches being arranged in series relative to one each of the second connections, wherein each of the second connections, in the closed state of the first switch being arranged in series relative to the second connection, is connected to a first node via this first switch and wherein the first node is connected to the first connection via the current and/or voltage sensor.

In the device according to the invention it is sufficient if one circuit with the above characteristics is used. With such a circuit having only one sensor and depending on the position of the first switches, the detection of whether a trailer has been attached resp. electrically connected to the drawing vehicle, or whether the lamps in the trailer can carry a current required for the proper operation of the lamps.

The circuit of a device according to the invention can have a second controllable switch being arranged in series relative to the current and/or voltage sensor and the first connection. By means of this second switch, the circuit can be activated or put in the standby mode in which measurement is not possible. In the standby mode, current consumption in the circuit can be avoided or at least be reduced relative to an active state of the circuit in which measurement is possible.

The circuit can have a diode connected in series to the current and/or voltage sensor, the first connection and possibly the second switch. This diode represents a simple protection against an incorrect connection of the device to a vehicle electric system (reverse polarity protection diode).

The first node of the circuit of a device according to the invention can be connected via a third controllable switch with a third connector for the connection to ground of a vehicle electric system. A resistor can be arranged in series relative to the third switch. This resistor can be a reference resistor. The reference resistor can carry a reference current with the first switches open and the third switch closed, which is detected by the current and/or voltage sensor to execute a calibration of the sensor or a plausibility check of the function of the switch.

The device according to the invention advantageously features a control which is connected with the control connections of the first switches and possibly of the second and/or third switch. By controlling the second switch with the control, the circuit can be changed from the standby mode to the active mode and back, wherein in the active state of the circuit measurements are possible with the current and/or voltage sensor. A first switch or groups of first switches can be triggered to close by means of the control.

In a procedure according to the invention for the monitoring of a trailer connection box with an above described device according to the invention, groups of first switches to be defined can be closed to check whether an electric system of a vehicle trailer is connected to the connection box. These switches may for example be the first switches over which currents flow to the direction indicators and the tail lamps. The total of these currents then also flows through the current and/or voltage sensor of the circuit. If the total current values exceed a specified threshold of for example 40 mA, a trailer is detected as attached resp. electrically connected. If, however, the total current value is smaller than the specified threshold, the trailer is not detected.

By sequentially closing the first switches, it can be checked whether a current-carrying load is connected to the second connection being arranged in series relative to the closed switch, and in particular if an operative lamp is present. When a current lying above a threshold value is detected by the current and/or voltage sensor, it is assumed that the connected lamp of the trailer operates properly. Otherwise, the failure of the lamp can be indicated.

The current and/or voltage sensor can be an integrated circuit. It is possible, that the circuit comprises a measuring resistor. It is also possible, that the measuring resistor is a separate component being connected to the integrated circuit.

A device according to the invention can comprise an evaluation unit in which the measuring signal provided by the current and/or voltage sensor is evaluated. The evaluation unit can be a micro-controller.

In comparison to the technology known to the applicant so far, the evaluation unit can be equipped in a more basic manner, as only the signal of one sensor needs to be evaluated.

The installation space required for the circuit can be reduced relative to prior art known to the applicant. Also, the device according to the invention can recognize more accurately whether a trailer is connected or not, which, like the reduced installation space depends directly on the number of components used.

BRIEF DESCRIPTION OF THE DRAWINGS

Reference is now made more particularly to the drawings, which illustrate the best presently known mode of carrying out the invention and wherein similar reference characters indicate the same parts throughout the views.

FIG. 1 is a simplified circuit diagram of a circuit of a device according to the invention.

FIG. 2 is a simplified flow diagram of a procedure for trailer detection.

DETAILED DESCRIPTION OF THE DRAWINGS

The circuit of a device according to the invention has a first connection VBB. This is connected to the positive potential of the vehicle electric system voltage in a device installed in a vehicle. In motor vehicles, this is usually connected to the battery/generator terminal called terminal 30.

The cathode of a reverse polarity protection diode D1 is connected to the first connection, the anode of which is connected to a second switch S2. The second switch S2 can preferably be controlled from a control of the device, the control not being depicted.

A current sensor SI is connected in series to the Diode D1 and the second switch S2. More precisely, the current sensor S1 has a measuring resistor, which is connected in series to the diode D1 and the second switch S2. In addition to the measuring resistor, the current sensor has an integrated circuit, which detects the current through the measuring resistor and transforms it into a signal indicating the current.

On the side facing away from the second switch S2, the current sensor SI is connected to a first node with seven first switches S11, . . . , S17 and a third switch S3. The first switches S11, . . . , S17 are arranged between the first nodes and second connections Brkl, PosLL, PosLR, TurnSR, RevL, FogL. The second connections serve the connection of the circuit with contacts of a connection box of the motor vehicle. In detail, the connection Brkl serves the connection with a contact of the connection box for the connection with stop lights of the trailer, the connection PosLL serves the connection with a contact for the connection with a left-hand tail lamp, the connection PosLR serves the connection with a contact for the connection with a right-hand tail lamp, the connection TurnSL serves the connection with a contact for the connection with a left-hand direction indicator, the connection TurnSR serves the connection with a contact for the connection with a right-hand direction indicator, the connection RevL serves the connection with a contact for the connection with a back-up light and the connection FogL serves the connection with a contact for the connection with a rear fog lamp.

When the second switch S2 is closed and one of the first switches S11, . . . , S17 is closed, a current can flow via this first switch S11, . . . , S17 to the lamp of the connected trailer connected to this first switch S11, . . . , S17. When several first switches S11, . . . , S17 are closed, a current can flow to all lamps of a connected trailer connected to the closed first switches S11, . . . , S17. The current flowing to the switch or switches can be measured by means of the current sensor SI.

Via the third switch S3 and a reference resistor Rrf being connected in series relative to the former, the first node is connected to a third connection being connected to the ground potential of the motor vehicle electric system during the operation of the device. When the second and the third switches S2, S3 are closed and if simultaneously all first switches S11, . . . , S17 are open, a current flows to ground via the reference resistor Rrf. This current can be measured by the current sensor S1 for calibration purposes and for the functional testing of the device according to the invention.

Testing whether a trailer is connected to the drawing vehicle or not can for example be executed according to the procedure outlined in FIG. 2.

If the circuit is in standby mode, the control of the device is initially activated by a WKUP signal by an external control unit. Then the control activates a circuit (application start). To this end the second switch being opened in standby mode is closed. By closing the second switch, the circuit (called test circuit in FIG. 2) is switched on. Now the first switches S12, S13, S14, S15 are closed by the control, while the remaining first switches S11, S16, S17 and the third switch S3 remain in an open state. Now a current can flow via the second switch S2, the current sensor S1 to the first node K. It then splits up and flows via the closed first switches S12, S13, S14, S15 and the connections POSLL, POS LR, TurnSL, TurnSR to the right and left tail light and to the right and left direction indicator. The current flowing through the current sensor is measured and compared to a threshold value of e.g. 40 mA in an evaluation unit. If the current is smaller than the defined threshold of e.g. 40 mA, there is no trailer present.

If, in contrast, the threshold value is exceeded, a trailer is detected.

In that case, a cyclic current measurement can take place, for which all first switches S11, . . . , S17 are closed sequentially to check whether the lamps of the trailer connected to the second connections Brkl, POSLL, POS LR, TurnSL, TurnSR, RevL, FogL can carry a current which is sufficient for the operation of the lamps. Once the cyclic measurement has been completed, it is checked whether standby is to be initiated or in case of missing lamp exits (e.g. defective lamp) a de-coupling detection shall be executed. If this request exists, the presence of the trailer is checked, i.e. whether the current flowing via the closed first switches S122, S13, S14, S14 and the connections POSLL, POS LR, TurnSL, TurnSR to the right and left tail light and to the right and left direction indicator is larger than the threshold value of 40 mA. If this is the case, its is checked, whether the circuit is to be put into standby mode. If this is the case, the circuit is put into standby mode by opening the second switch. If no standby mode is to be assumed, the cyclical current measurement is repeated.

| Reference Sign List | |
|---|---|
| VBB | First connection |
| BrkL | connection for the connection with the contact of the connection box for the connection to the stop lights |
| PosLL | Connection for the connection with the contact of the connection box for the connection to the left stop light |
| PosLR | Connection for the connection with the contact of the connection box for the connection to the right stop light |
| TurnSL | Connection for the connection with the contact of the connection box for the connection to the left direction indicator |
| TurnSR | Connection for the connection with the contact of the connection box for the connection to the right direction indicator |
| RevL | Connection for the connection with the contact of the connection box for the connection to the backup light |
| FogL | Connection for the connection with the contact of the connection box for the connection to the rear fog lamp |
| D1 | Reverse battery protection diode |
| S11 | First switch for the switching of a circuit via the stop lights |
| S12 | First switch for the switching of a circuit via the left tail lamp |
| S13 | First switch for the switching of a circuit via the right tail lamp |

| Reference Sign List | |
|---|---|
| S14 | First switch for the switching of a circuit via the left direction indicator |
| S15 | First switch for the switching of a circuit via the right direction indicator |
| S16 | First switch for the switching of a circuit via the backup light |
| S17 | First switch for the switching of a circuit via the rear fog lamp |
| S2 | Second switch |
| S3 | Third switch |
| SI | Current sensor |
| K | First node |
| Rrf | Reference resistor |

The invention claimed is:

1. A device for the monitoring of a trailer connection box of a vehicle to which the electrical system of a trailer can be connected, comprising:
a circuit, including:
a first connection for coupling with a positive potential of a voltage of an electric system of the vehicle,
a plurality of second connections for coupling with contacts of the trailer connection box,
at least one of a current and voltage sensor,
a plurality of first switches each connected in series to a respective one of the plurality of second connections,
wherein, in a closed state of each of the plurality of first switches connected in series to each of the plurality of second connections, each of the second connections is connected via its respective first switch with a first node,
wherein the first node is connected to the first connection via at least one of the current and voltage sensor,
wherein when the device checks whether a current-carrying load is connected to each of the plurality of second connections, a first switch of the plurality of first switches associated with a second connection of the plurality of second connections are sequentially closed.

2. The device according to claim 1, wherein the circuit has a second controllable switch connected in series to at least one of the current and voltage sensor, and the first connection.

3. The device according to claim 1 wherein the circuit has a diode connected in series to at least one of the current and voltage sensor, and the first connection.

4. The device according to claim 1 wherein the first node is connected with a third connection for connection with a ground potential of a vehicle electric system via a third controllable switch.

5. The device according to claim 4, wherein a resistor is connected in series to the third switch.

6. The device according to claim 1, wherein by means of a second switch coupled to the first switch, the mode of the circuit is changed from the stand-by mode into an active mode and vice versa; and
wherein in the active mode of the circuit, measuring is accomplished with at least one of the current and voltage sensor.

7. The device according to claim 1, wherein a first switch of the plurality of first switches or a plurality of first switches is controlled with regard to closing.

8. A procedure for the monitoring of a trailer connection box comprising a device according to claim 1 comprising the step of closing a plurality of first switches to check whether the electric system of a vehicle trailer is connected to the connection box.

\* \* \* \* \*